United States Patent
Jafari et al.

(10) Patent No.: US 7,254,033 B2
(45) Date of Patent: Aug. 7, 2007

(54) METHOD AND APPARATUS FOR HEAT DISSIPATION

(76) Inventors: Behdad Jafari, 20862 Sarahills Dr., Saratoga, CA (US) 95070; Inderjit Singh, 18136 Arroyo La., Saratoga, CA (US) 95070

( * ) Notice: Subject to any disclaimer, the term of this patent is extended or adjusted under 35 U.S.C. 154(b) by 250 days.

(21) Appl. No.: 10/922,396

(22) Filed: Aug. 19, 2004

(65) Prior Publication Data

US 2006/0039118 A1   Feb. 23, 2006

(51) Int. Cl.
*H05K 7/20* (2006.01)
(52) U.S. Cl. ............... 361/719; 361/704; 361/705; 361/718; 257/675; 257/706; 257/707; 165/80.3; 165/185

(58) Field of Classification Search ........ 361/702–710, 361/712–719, 722–724, 752–762; 257/698, 257/712–715, 720, 722, 693, 779, 738, 777, 257/778, 749; 165/80.3, 80.4, 185, 104.33, 165/104.26; 174/16.3, 252, 15.2; 438/106, 438/112, 118, 122, 177, 460
See application file for complete search history.

(56) References Cited

U.S. PATENT DOCUMENTS

| | | | | |
|---|---|---|---|---|
| 4,914,551 | A | * | 4/1990 | Anschel et al. ............. 361/714 |
| 5,396,403 | A | * | 3/1995 | Patel ........................... 361/705 |
| 6,229,216 | B1 | * | 5/2001 | Ma et al. ..................... 257/777 |
| 6,236,568 | B1 | * | 5/2001 | Lai et al. ..................... 361/704 |
| 6,665,187 | B1 | * | 12/2003 | Alcoe et al. ................ 361/719 |
| 6,724,631 | B2 | * | 4/2004 | Ye et al. ...................... 361/719 |
| 7,031,162 | B2 | * | 4/2006 | Arvelo et al. ............... 361/718 |
| 7,074,645 | B2 | * | 7/2006 | Huang et al. ............... 438/106 |
| 2005/0224955 | A1 | * | 10/2005 | Desai et al. ................. 257/706 |

* cited by examiner

*Primary Examiner*—Michael Datskovskiy
(74) *Attorney, Agent, or Firm*—Berkeley Law & Technology Group, LLP

(57) ABSTRACT

Embodiments of methods, apparatuses, devices, and/or systems for heat dissipation are disclosed.

25 Claims, 4 Drawing Sheets

METHOD AND APPARATUS FOR HEAT DISSIPATION

BACKGROUND

As the circuit density of microelectronic components increases, heat generated by these devices may typically increase as well. Microelectronic components may include, for example, microprocessors, such as central processing units (CPU), graphic processing units (GPU), digital signal processors (DSP); one or more memory devices; one or more application specific integrated circuits (ASIC); and other types of electronic components such as capacitors and/or resistors, as just a few examples. Various techniques may typically be used to remove or dissipate heat generated by a microelectronic component. These techniques may include passive and/or active thermal solutions, for example. One such technique, which may be classified as a passive thermal solution, involves the use of a thermally conductive device in thermal contact with a microelectronic component. This thermally conductive device may comprise a mass of thermally conductive material such as a slug or heat spreader, or may comprise a device configured to enhance convective heat transfer, such as a heat sink. However, techniques for heat dissipation and/or removal may not produce the desired results, and additional techniques and/or devices for dissipating and/or removing heat continue to be desired.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference of the following detailed description when read with the accompanying drawings in which:

DETAILED DESCRIPTION

Figure 1:
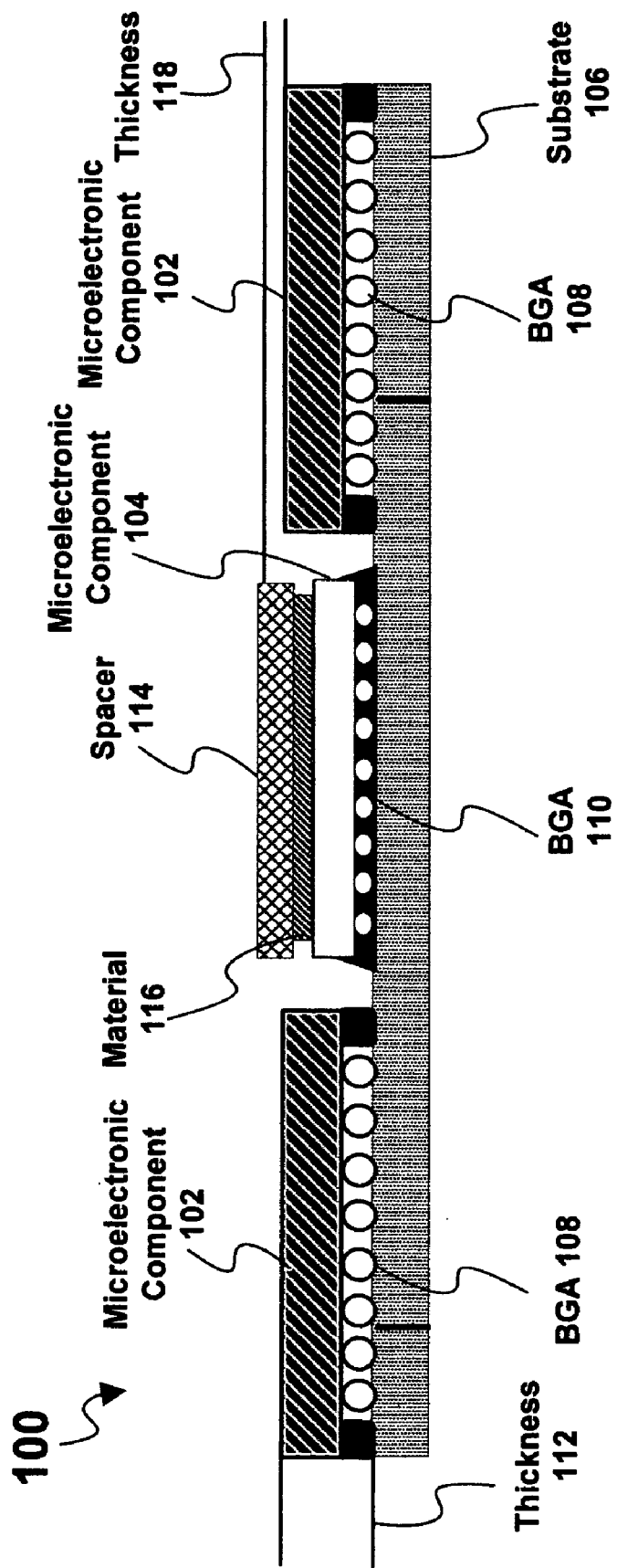
FIG. 1 is a cross sectional view of an electronic assembly, in accordance with at least one embodiment.

In the following detailed description, numerous specific details are set forth to provide a thorough understanding of the claimed subject matter. However, it will be understood by those skilled in the art that the claimed subject matter may be practiced without these specific details. In other instances, well-known methods, procedures, components and/or circuits have not been described in detail so as not to obscure the claimed subject matter.

An electronic assembly may comprise one or more electronic components coupled to a substrate, and may additionally be referred to as an electronic package, for example. The substrate, in at least one embodiment, may comprise a printed circuit board (PCB), for example, and may be comprised of one or more layers, which may be laminated layers, for example, and may include conductive and/or non-conductive layers, and one or more layers may have one or more conductive features formed thereon, for example. In one embodiment, a PCB may comprise one or more layers of non-conductive material interleaved and/or laminated with one or more conductive circuit patterns and/or one or more additional layers, for example. Additionally, an electronic assembly or electronic package may comprise one or more microelectronic components, including, for example, integrated circuit (IC) components such as one or more microprocessors, graphics processing units (GPU), digital signal processors (DSP) and/or a central processing units (CPU), one or more memory devices, one or more application specific integrated circuits (ASIC), and may include other types of electronic components such as capacitors, resistors, and/or connectors including input/output (I/O) connectors for coupling to external circuitry, such as bus circuitry, for example, but it is important to note that the claimed subject matter is not so limited. In at least one embodiment, one or more electronic assemblies may be coupled to form an electronic device. Examples of electronic devices may include, for example, computers, including desktop computers, laptop computers, servers, switches, and/or hubs, handheld devices, including digital cameras and cellular or wireless telephones, and may additionally include peripheral devices, including printers, monitors, and/or scanners, for example. Those skilled in the art will recognize, however, that particular embodiments are not limited in this respect, but may be applicable to any electronic assembly and/or electronic device that utilizes one or more microelectronic components, for example.

As alluded to previously, a microelectronic component may generate heat, and a thermal solution may be utilized to at least partially dissipate the generated heat, for example. A thermal solution may comprise one or more heat dissipation devices, and may generally be classified as active and/or passive thermal solutions. In this context, active thermal solutions may refer generally to heat dissipations devices wherein at least a portion of the heat dissipation device utilizes energy to at least partially dissipate heat, such as electrical energy, chemical energy, and/or fluid energy, for example. Although the claimed subject matter is not so limited, one or more active thermal solutions may comprise fans, refrigeration components, and/or thermoelectric components, also referred to as Peltier devices, as just a few examples. Additionally, passive solutions may refer generally to heat dissipation devices wherein heat dissipation is performed primarily by one or more heat transfer modes, such as conduction and/or convection, and without the use of additional energy, for example. Although the claimed subject matter is not so limited, one or more passive thermal solutions may comprise heat spreaders, such as integrated heat spreaders (IHS), heat slugs, and/or heat sinks, such as finned or pinned heat sinks, but it is important to note that the claimed subject matter is not limited to any particular thermal solution. Thermal solutions such as these may be comprised of one or more materials, which may be thermally conductive, for example, although the claimed subject matter is not so limited. For example, one or more of the aforementioned devices may be comprised of aluminum, copper, such as electrolytically plated copper, copper alloy, ceramic, silicon, nickel, gold, and/or alloys thereof and/or a combination thereof, although, again, the claimed subject matter is not so limited. Additionally, a thermal solution utilized for a particular microelectronic component may comprise a combination of one or more passive and active solutions, such as a heat sink with a fan, for example. But, again, the claimed subject matter is not limited in this respect.

A heat dissipation device may be in at least partial thermal contact with a microelectronic component. In at least one embodiment, thermal contact may be at least partially achieved by use of a thermally conductive material, such as a thermal interface material (TIM) disposed between the microelectronic component and heat dissipation device, for example. Typical thermal interface materials may include, for example, thermally conductive gels, greases, epoxies, pastes, solders, phase change material, and/or metal filled polymers, gels or epoxies, which may have one or more types of thermally conductive fillers such as aluminum particles and/or silver particles interspersed therein, for example, although, of course, the claimed subject matter is not limited to any particular type of thermal interface material, and/or to use of any thermal interface material, for example.

Referring now to FIG. 1, there is illustrated a cross sectional view of an electronic assembly, in accordance with at least one embodiment. Illustrated in FIG. 1 is electronic assembly 100. Electronic assembly 100 comprises a plurality of microelectronic components coupled to a substrate 106. In this embodiment, substrate 106 may comprise a PCB, and may be comprised of one or more conductive and/or nonconductive layers (not shown), which may be laminated, for example. Substrate 106 is coupled to one or more microelectronic components 102 and 104, which may comprise one or more types of microelectronic components, as described previously. However, in this embodiment, microelectronic components 102 may comprise memory devices, and may include, for example, Random Access Memory (RAM) such as one or more types of Dynamic Random Access Memory (DRAM), including Synchronous Dynamic Random Access Memory (SDRAM) or Dual Data Rate memory (DDR, DDR2), as just a few examples. Additionally, microelectronic component 104 may comprise a microprocessor, such as a GPU, for example. Although component 104 is illustrated here as a flip chip, the claimed subject matter is not so limited. Additionally, although the components are illustrated as being coupled to the substrate by use of one or more ball grid arrays (BGA) 108 and 110, those skilled in the art will recognize that alternative attachment methods exist. For example, microelectronic components in accordance with the claimed subject matter may include components with varying configurations, such as, for example, pin grid array, ball grid array, ball grid array with pinned interposers and wire bonding, although, again, these are just examples, and the claimed subject matter is not limited in this respect, and may be applicable to any microelectronic component and/or attachment method resulting in the formation of an electronic assembly comprising at least one microelectronic component capable of generating heat, for example.

However, continuing with this embodiment, a material 116 may be disposed substantially between component 104 and a spacer 114, and may comprise one or more thermally conductive materials, such as a thermal epoxy and/or paste, as just an example. Additionally, spacer 114 may comprise a substantially planar device that may be at least partially thermally conductive, although the claimed subject matter is not so limited. In one exemplary embodiment, spacer 114 may comprise substantially the same material as component 104, for example, and may be formed to a thickness, such as substantially within the range of approximately 50–100 microns, for example. This may provide particular advantages such as thermal expansion rates, explained in more detail later. For example, in one embodiment, wherein component 104 substantially comprises silicon, spacer 114 may be substantially comprised of silicon, for example. When assembled into electronic assembly 100, component 104 may be in at least partial thermal contact with spacer 114, by use of material 116, for example. Additionally, when assembled, component 102 may have a particular thickness 112, and the component 104 in combination with material 116 and spacer 114 may have a particular thickness 118. In at least one embodiment, thickness 118 may comprise the difference in height between the top surface of component 102 to the top surface of spacer 114, for example, and may comprise a thickness, such as a thickness substantially within the range of approximately 0.1 millimeters, for example. Thickness 118, in at least one embodiment, may provide one or more advantages, as will be explained in more detail later.

Figure 2:
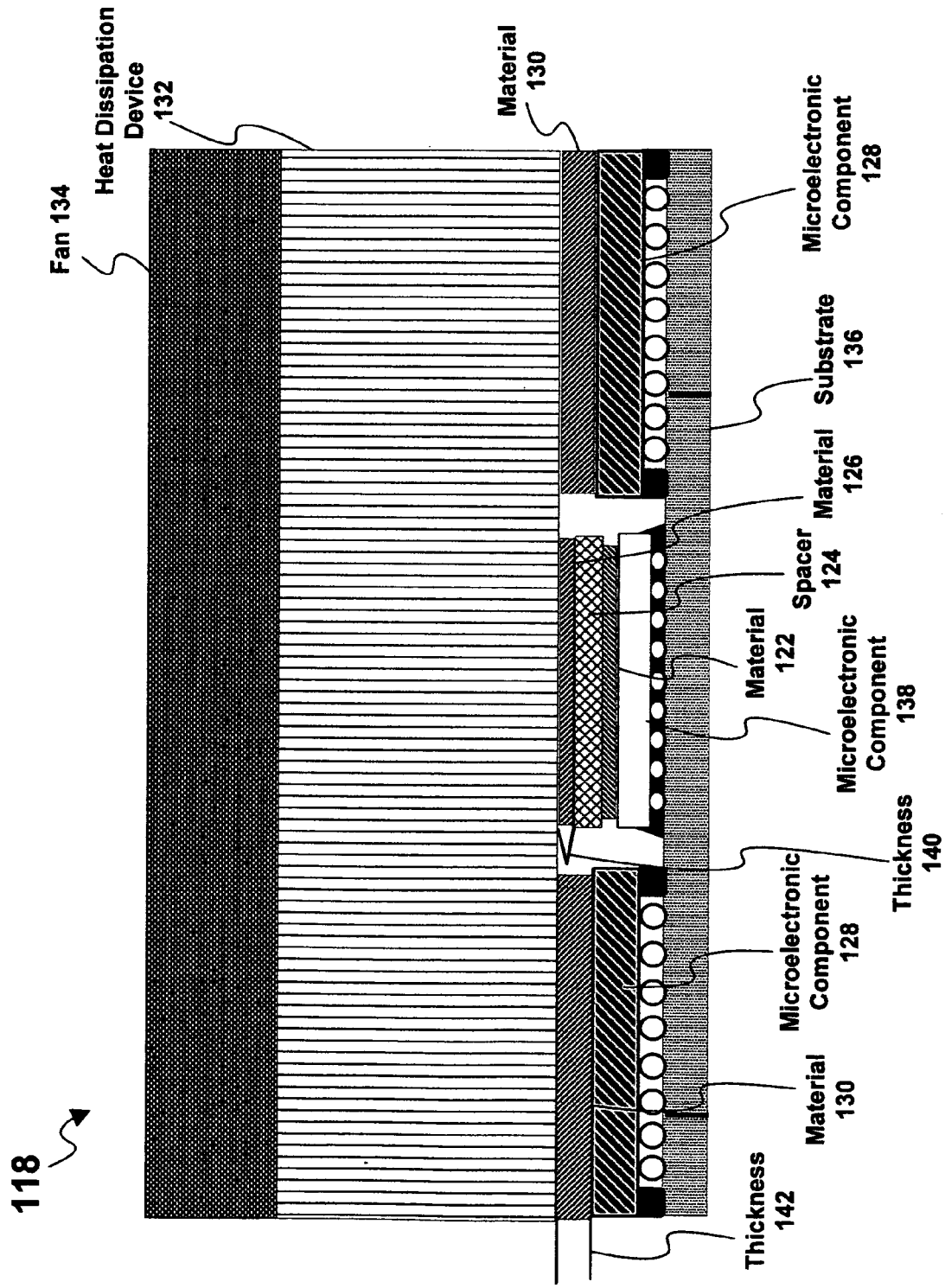
FIG. 2 is a cross sectional view of an electronic assembly and thermal solution, in accordance with at least one embodiment.

Referring now to FIG. 2, there is illustrated a cross sectional view of an electronic assembly 118, in accordance with at least one embodiment. Illustrated in FIG. 2 is electronic assembly 118. Electronic assembly 118 comprises a plurality of microelectronic components coupled to a substrate 136. Similarly to FIG. 1, in one embodiment, substrate 136 may comprise a PCB, and may be comprised of one or more conductive and/or nonconductive layers (not shown), which may be laminated, for example. Substrate 136 is coupled to one or more microelectronic components 138 and 128, which may comprise one or more types of microelectronic components, as described previously. Formed on components 128 is a material 130, which may comprise a thermally conductive material such as a TIM, for example. Material 130, in at least one embodiment, may comprise thermally conductive grease, for example, although the claimed subject matter is not so limited. Component 138 may have a material 122 formed thereon, and material 122 may comprise one or more thermally conductive materials, such as a thermal epoxy, as just an example. Additionally, a spacer 124 may be coupled to component 138 and/or material 122, and, in one embodiment, may be substantially comprised of the same and/or similar material as component 138, for example. A material 126 may be formed on at least a portion of the top surface of spacer 124, for example, and may comprise a thermally conductive material, such as a thermal grease, and may comprise substantially similar material to that formed on at least a portion of one or more components 128, for example. A heat dissipation device 132 may be coupled to one or more materials 130 and/or 126, and may be in at least partial thermal contact with materials 130 and/or 126, components 128 and/or 138, and/or spacer 124 and material 122, for example. In at least one embodiment, heat dissipation device 132 may comprise a heat sink, such as a finned heat sink, and may have a fan 134 coupled thereto, although, of course, this is just one configuration, and the claimed subject matter is not so limited. Additionally, heat dissipation device 132 and/or fan 134 may be coupled to one or more of the aforementioned components by use of one or more adhesive materials, and/or one or more mechanical attachment mechanisms such as clamps and/or pins (not shown), for example. It is important to note, however, that numerous configurations of a heat dissipation device as well as numerous methods of attachment exist, and the claimed subject matter is not so limited.

In operation, although the claimed subject matter is not so limited, heat may be conducted from components 138 and/or 128 to the heat dissipation device 132, for example. For example, in one embodiment, heat that is generated by components 128 may be at least partially transferred by conduction through at least a portion of material 130 and to heat dissipation device 132. Similarly, heat that is generated by component 138 may be at least partially transferred by conduction through at least a portion of material 122, through at least a portion of spacer 124, and through at least a portion of material 126 to heat dissipation device 132. In this embodiment, heat is transferred from the heat dissipation device 132 to the surrounding air by convection, which may be assisted by use of fan 134, for example.

As alluded to previously in reference to FIG. 1, the distance between the top surface of substrate 136 to the top surface of components 128 may be less than the distance between the top surface of substrate 136 and the top surface of spacer 124. This may result in materials 130 and 126 having particular thicknesses 140 and 142, respectively. In at least one embodiment, thickness 142 may be substantially within the range of approximately 0.1 millimeters thicker than thickness 140, for example, although, of course, the claimed subject matter is not so limited. In this embodiment, however, improved thermal conductivity may exist between spacer 124 and heat dissipation device 132, and components 128 and heat dissipation device 132, for example. This may be due, at least in part, on the thermal conductivity of materials 130 and 126, and, in at least one embodiment, wherein materials 130 and 126 may be substantially similar, thermal conductivity may increase as the thickness of the material decreases. This may be due, at least in part, to the thermal conduction properties of materials such as 130 and 126, for example, which, in at least one embodiment, may be less than the thermal conduction properties of other materials and/or devices, such as spacer 124 and/or material 122, for example. Additionally, in this embodiment, wherein thermal conduction properties may be greater for spacer 124 and/or material 122 than for material 130, heat may be dissipated at a greater rate between component 138 and heat dissipation device 132, than between components 130 and heat dissipation device 132, for example. This may provide an improved path of heat conduction for the component 138, which may result in heat generated by component 138 being conducted to heat dissipation device and subsequently dissipated, rather than being conducted from component 138 to components 128, for example. Additionally, for the embodiment wherein the spacer 124 comprises substantially the same material as component 138, when heat is generated by component 138, component 138 may expand, depending on factors such as the coefficient of thermal expansion of one or more of the materials comprising component 138, for example. Additionally, because spacer 124 is comprised of substantially the same material in this embodiment, spacer 124 may expand at a similar rate as component 138 when heat is transferred to the spacer, for example. This may provide particular advantages such as improved structural integrity and/or rigidity between component 138 and spacer 124, may provide for steady heat transfer rates, for example, and/or may allow for an extended lifespan of the assembly 118, such as by reducing the thermal and/or mechanical stresses between one or more of the components, for example. Additionally, a spacer such as spacer 124 may provide secondary advantages, such as by providing protection against mechanical damage from a thermal solution, as just an example.

Figure 3:
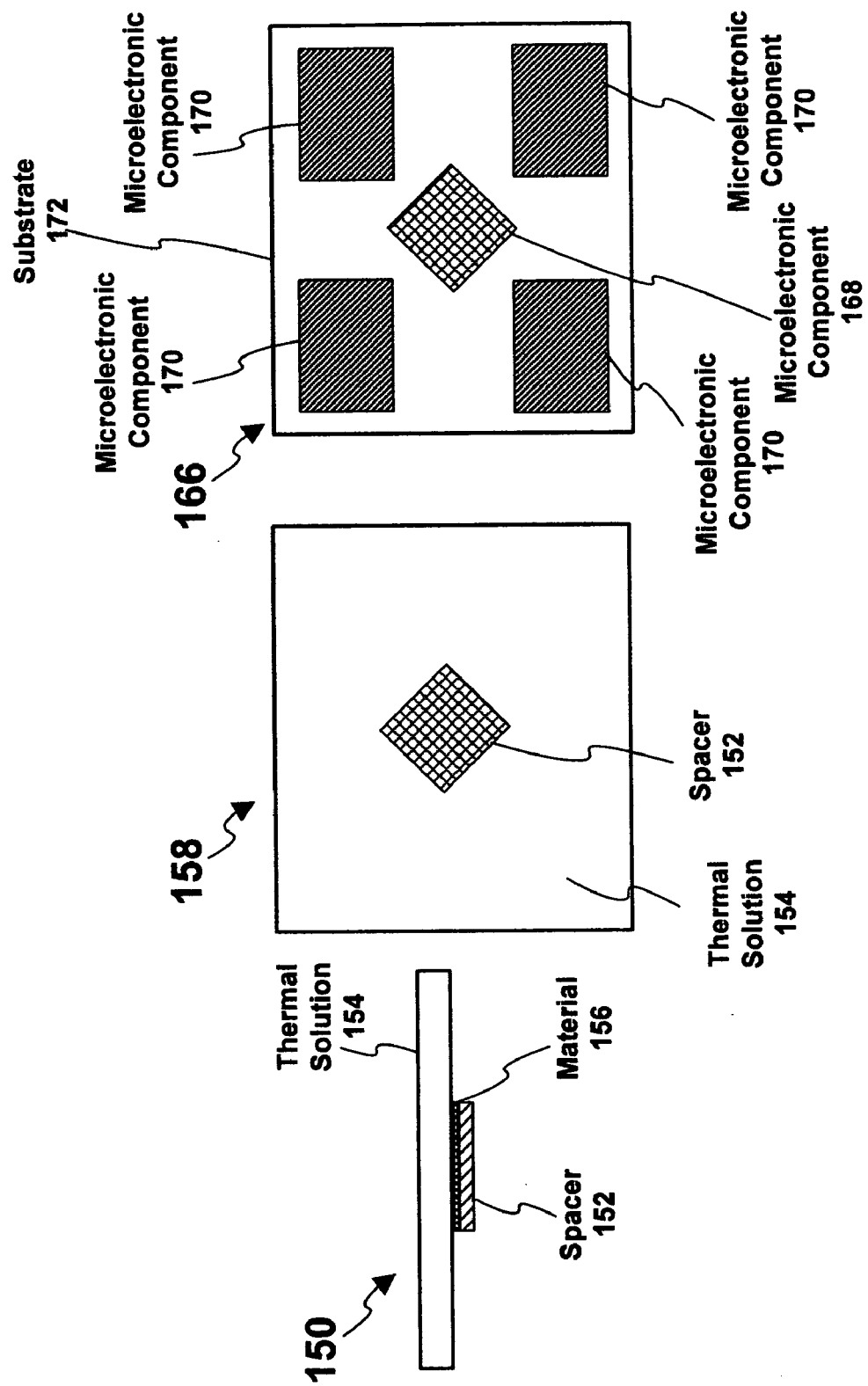
FIG. 3 illustrates multiple views of an electronic assembly and thermal solution, in accordance with one or more embodiments.

Referring now to FIG. 3, there are illustrated multiple views of an electronic assembly and thermal solution and spacer assembly, in accordance with one or more embodiments. Illustrated in FIG. 3 are two views, 150 and 158 of a thermal solution and spacer assembly. Thermal solution 154 may comprise one or more active and/or passive thermal solutions, such as one or more heat dissipation devices, as explained previously. Spacer 152 may comprise a device that is configured to be coupled with a microelectronic component, and may, depending on the particular shape of the microelectronic component, be substantially planar, although this is not a requirement. Materials utilized to form spacer 152 may vary, and may include copper, aluminum, nickel and/or gold, for example, but in one particular embodiment, spacer 152 may comprise substantially the same material as a microelectronic component that is to be coupled to spacer 152, such as silicon and/or silicon dioxide, if, for example, the microelectronic component comprises a silicon and/or silicon dioxide based device, for example. Spacer 152 may be formed to a particular thickness, such as substantially within the range of approximately 50–100 microns, for example, and may be coupled to thermal solution 154 by use of a material 156. Material 156 may comprise one or more thermally conductive greases, gels, and/or epoxies, for example, as explained previously. The thermal solution and spacer assembly may be configured to be coupled with electronic assembly 166. Electronic assembly 166, in this embodiment, may comprise a plurality of microelectronic components 168 and 170 coupled to a substrate 172, for example. Similarly to FIG. 1, substrate 172 may comprise a PCB, and may be comprised of one or more conductive and/or nonconductive layers (not shown), which may be laminated, for example. Substrate 106 is coupled to one or more microelectronic components 168 and 170, which may comprise one or more types of microelectronic components, as described previously. However, in this embodiment, microelectronic components 170 may comprise memory devices, such as Random Access Memory (RAM) such as one or more types of Dynamic Random Access Memory (DRAM), including Synchronous Dynamic Random Access Memory (SDRAM) or Dual Data Rate memory (DDR), as just a few examples, and microelectronic component 168 may comprise a microprocessor, such as a GPU, for example. In at least one embodiment, microelectronic assembly 166 may be referred to as a multichip module (MCM), for example.

As alluded to previously, particular components may generate more heat than other components. For example, in one embodiment, wherein component 168 comprises a GPU, component 168 may generate heat substantially within the range of approximately 10–70 watts, and wherein components 170 comprise memory components, components 170 may generate heat substantially within the range of 0–2 watts, as just an example. Therefore, it may be desirable to provide increased heat dissipation for component 168 than for components 170, for example. In this embodiment, when assembled into an assembly such as illustrated in FIG. 2, spacer 152 may be coupled to component 168 by use of one or more thermally conductive materials, such as thermal epoxy, for example, applied to a particular thickness between component 168 and spacer 152. Additionally, components 170 may be coupled to thermal solution 154 by use of one or more conductive materials, such as thermal grease, for example, which may also be applied to a particular thickness. In one embodiment, the thickness of the thermal interface material coupling spacer 152 with thermal solution 154 may be less than the thickness of the thermal interface material coupling components 170 with thermal solution 154, such as substantially within the range of approximately 0.1 millimeters less, in one embodiment. This may result, for example, in improved heat transfer between device 168 and thermal solution 154 than between components 170 and thermal solution 154, for example. Thus, an apparatus for heat dissipation may be provided, that will provide heat dissipation for one or more microelectronic components.

Figure 4:
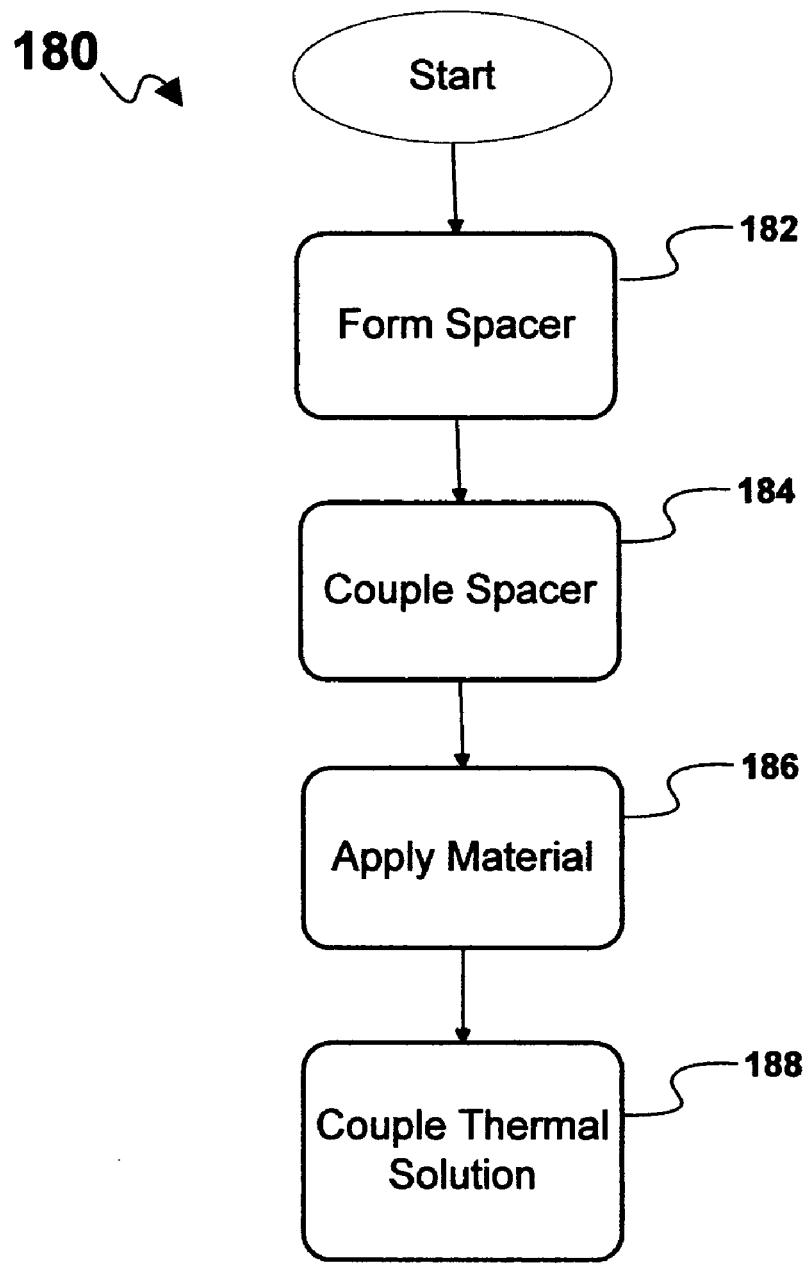
FIG. 4 is a block diagram illustrating a method of forming an electronic assembly, in accordance with at least one embodiment.

In one particular embodiment, a method of making one or more of the aforementioned devices and/or assemblies is illustrated in FIG. 4. FIG. 4 illustrates a flowchart 180, with numerous blocks. However, the claimed subject matter is not so limited, and the order in which the particular operations are presented does not necessarily imply a particular order of operation, and the claimed subject matter may comprise one or more methods comprising one or more of the following operations, and may comprise additional intervening, substitute, or subsequent operations. At a high level, a spacer may be formed at block 182. At block 184, the spacer may be coupled to a microelectronic component, such as by use of a thermally conductive adhesive material. At block 186, one or more thermally conductive materials may be applied to at least one surface of the spacer. At block 188, a thermal solution may be placed in at least partial thermal contact with the spacer, such as by use of the thermally conductive material applied at block 186, for example.

More specifically, in this embodiment, a spacer may be formed at block 182. A spacer, in at least one embodiment, may be formed from a material that is at least partially thermally conductive, such as copper, aluminum, nickel and/or gold, for example, but in one particular embodiment, the spacer may comprise substantially the same material as a microelectronic component that is to be coupled to the spacer at block 184, such as silicon and/or silicon dioxide, but, of course, the particular spacer material may depend at least in part on the material(s) utilized to form the microelectronic component, for example. This particular embodiment may provide particular advantages such as improved tolerance control as compared to one or more other materials, and/or the capability of utilizing tooling that may be used for the formation of one or more microelectronic devices, as just a few examples. A spacer formed at block 182 may be formed to have a variety of shapes, thicknesses and/or configurations, but in one embodiment may be formed to be coupled with a substantial portion of one or more surfaces of a microelectronic component, such as a top surface, bottom surface, and/or one or more side surfaces, depending on the particular configuration of the microelectronic component, such as if the device is top mounted, bottom mounted or side mounted on a substrate, for example. If, for example, a surface of the microelectronic component is substantially planar, and the substantially planar surface is suitable for mounting a spacer, such as by being at least partially exposed, for example, the spacer may then be formed to have a substantially planar surface, that may be configured to be coupled to the exposed surface of the microelectronic component, for example. Additionally, one or more other surfaces of the spacer may have particular configurations, such as substantially planar, for example, but, of course, the claimed subject matter is not so limited. In at least one embodiment, the spacer may be formed to have two opposing surfaces that are substantially parallel, for example, such that one surface of the spacer may be coupled to a microelectronic component, and a thermal solution may be coupled to the opposing surface of the spacer, for example.

Although numerous methods exist for forming a spacer, in at least one embodiment, a spacer may be formed by use of one or more machining processes, such as one or more milling, sawing, cutting and/or grinding processes such as back grinding, although, of course, particular methods of fabrication may depend on factors such as the particular material or combination of materials utilized to form the spacer, and/or the desired tolerances of the spacer, for example. In one embodiment, wherein a spacer is substantially formed from silicon, one or more milling processes may be utilized to form a spacer having one or more substantially planar surfaces, for example.

In this embodiment, at block 184, the spacer may be coupled to a microelectronic component. In this context, coupled may refer to configuring the spacer such that at least partial thermal contact may exist between the spacer and a microelectronic component, but it is important to note that the spacer and microelectronic component may not necessarily be in physical contact, in at least one embodiment. Coupling may be accomplished by a variety of methods and by use of one or more materials and/or coupling devices, but in one particular embodiment, a thermally conductive epoxy may be utilized to couple the spacer to a microelectronic component. However, in alternative embodiments, one or more clips, clamps, pins, and or other mechanical attachment mechanisms may be utilized, and in one embodiment no method of coupling may be utilized to couple the spacer to a microelectronic component, but rather a coupling mechanism may be utilized to couple a thermal solution to a substrate coupled with the microelectronic component, such that the spacer is substantially constrained in place above the microelectronic component, for example. In at least one embodiment, the microelectronic component may comprise a device coupled to a substrate, and there may be additional devices coupled to the same substrate, for example.

In this embodiment, at block 186, one or more materials may be applied to the spacer, and/or may additionally be applied to one or more additional microelectronic components, such as one or more additional devices coupled to a substrate, for example. In at least one embodiment, substantially similar material may be applied to one or more microelectronic components not having a spacer, and to the spacer, such as thermal grease applied to one or more microelectronic components and the spacer, although this is not a requirement. Additionally, the one or more materials may be applied to a particular thickness. The thickness may vary between the spacer and one or more microelectronic components, and/or between microelectronic components, for example, depending, for example, on the particular thickness of the spacer and/or one or more of the microelectronic components, for example. In one embodiment, the one or more materials may be applied to a greater thickness to one or more microelectronic components than to the spacer, such as substantially within the range of approximately 0.1 millimeters thicker, for example.

In this embodiment, at block 188, a thermal solution may be coupled to one or more microelectronic components and/or the spacer, such as by being placed in thermal contact with one or more devices by use of one or more thermal interface materials, for example. For example, a passive and/or active thermal solution may be placed in thermal contact with one or more of the aforementioned devices, and may include one or more of the following: a heat spreader, heat sink, fan, thermoelectric device, refrigeration device, and/or one or more other devices and/or combinations of devices that are configured to at least partially dissipate heat, for example. In one embodiment, when assembled, a thermal solution may be in thermal contact with the spacer and/or one or more additional microelectronic components. In this embodiment, one or more thermal interface materials may at least partially provide thermal contact, and the thermal interface material(s) may have a particular thickness. The thickness of the thermal interface material may be greater between the thermal solution and one or more other microelectronic components than between the spacer and the thermal solution, such as substantially within the range of approximately 0.1 millimeters thicker, which may result in heat being dissipated more efficiently, and/or at an increased rate between the spacer and the thermal solution as compared to the one or more microelectronic components and the thermal solution. In one exemplarily embodiment, the spacer may be coupled to a microprocessor coupled to a substrate, and the substrate may also be coupled to one or more memory devices. In this embodiment, heat dissipation may be greater for the processor than for the one or more memory devices, for example.

It will, of course, also be understood that, although particular embodiments have just been described, the claimed subject matter is not limited in scope to a particular embodiment or implementation. For example, one embodiment of forming an electronic assembly and/or spacer may be at least partially embodied in hardware, such as implemented to operate on a device or combination of devices, as previously described, for example, whereas another embodiment may be in software. Likewise, an embodiment may be implemented in firmware, or as any combination of hardware, software, and/or firmware, for example. Likewise, although the claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, or other system, for example, may result in an embodiment of a method in accordance with the claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive, although, again, the claimed subject matter is not limited in scope to this example.

In the preceding description, various aspects of the claimed subject matter have been described. For purposes of explanation, specific numbers, systems and/or configurations were set forth to provide a thorough understanding of the claimed subject matter. However, it should be apparent to one skilled in the art having the benefit of this disclosure that the claimed subject matter may be practiced without the specific details. In other instances, well-known features were omitted and/or simplified so as not to obscure the claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of the claimed subject matter.

The invention claimed is:

1. An apparatus, comprising:
a substrate, the substrate having one or more layers;
a first microelectronic component coupled to the substrate, wherein the microelectronic component is comprised of one or more materials, and wherein the microelectronic component has a top and a bottom surface;
a second microelectronic component coupled to the substrate;
a spacer coupled to the top surface of the first microelectronic component, wherein the spacer is comprised of substantially the same one or more materials as the first microelectronic component; and
a heat dissipation device coupled to the spacer and the second microelectronic component wherein the spacer is configured to at least partially transfer heat from the first and the second microelectronic component to the heat dissipation device.

2. The apparatus of claim 1, wherein the first microelectronic component comprises one or more of: one or more integrated circuit (IC) components such as one or more microprocessors, graphics processing units (CPU), digital signal processors (DSP) and/or central processing units (CPU); one or more memory devices, one or more application specific integrated circuits (ASIC), one or more capacitors and/or one or more resistors.

3. The apparatus of claim 1, wherein the first microelectronic component is substantially comprised of a single material.

4. The apparatus of claim 3, wherein the first microelectronic component is substantially comprised of silicon and the spacer is substantially comprised of silicon.

5. The apparatus of claim 1, wherein the spacer is coupled to the first microelectronic component by use of one or more thermally conductive materials.

6. The apparatus of claim 5, wherein the thermally conductive materials comprises at least one of the following materials:
(a) thermally conductive gels, greases, epoxies, pastes, solders, phase change material; and/or
(b) metal filled polymers, gels or epoxies, which may have one or more types of thermally conductive fillers such as aluminum particles and/or silver particles interspersed therein.

7. The apparatus of claim 1, wherein the heat dissipation device comprises at one or more of: active and/or passive thermal solutions, wherein said thermal solutions include:
fans, refrigeration components, thermoelectric components, heat spreaders, including integrated heat spreaders (IHS), heat slugs, and/or heat sinks.

8. The apparatus of claim 1, wherein the heat dissipation device is coupled to the spacer by use of one or more thermally conductive materials.

9. The apparatus of claim 8, wherein the thermally conductive materials comprises at least one of the following materials:
(a) thermally conductive gels, greases, epoxies, pastes, solders, phase change material; and/or
(b) metal filled polymers, gels or epoxies, which may have one or more types of thermally conductive fillers such as aluminum particles and/or silver particles interspersed therein.

10. The apparatus of claim 1, wherein the apparatus comprises a multichip module (MCM).

11. An electronic assembly, comprising:
a substrate, wherein the substrate comprises one or more layers;
a first and a second microelectronic component coupled to the substrate;
a spacer coupled to the first microelectronic component, wherein the spacer has a thickness;
a quantity of thermally conductive material formed to a thickness on at least a portion of the spacer and formed to a thickness on at least a portion of the second microelectronic component, wherein the thickness of the thermally conductive material on the second microelectronic component is greater than the thickness of the thermally conductive material on the spacer; and a heat dissipation device in thermal contact with at least a portion of spacer and the second microelectronic component, such that thermal conductivity between the heat dissipation device and the spacer is greater than between the heat dissipation device and the second microelectronic component.

12. The electronic assembly of claim 11, wherein the first and second microelectronic components respectively comprise one or more of: one or more integrated circuit (IC) components such as one or more microprocessors, graphics processing units (GPU), digital signal processors (DSP) and/or central processing units (CPU); one or more memory devices, one or mare application specific integrated circuits (ASIC), one or more capacitors and/or one or more resistors.

13. The electronic assembly of claim 11, wherein the first microelectronic component and the spacer are substantially comprised of the substantially the same material.

14. The electronic assembly of claim 13, wherein the first microelectronic component and the spacer are substantially comprised of silicon.

15. The electronic assembly of claim 11, wherein the thermally conductive materials comprises at least one of the following materials:
    (a) thermally conductive gels, greases, epoxies, pastes, solders, phase change material; and/or
    (b) metal filled polymers, gels or epoxies, which may have one or more types of thermally conductive fillers such as aluminum particles and/or silver particles interspersed therein.

16. The electronic assembly of claim 11, wherein the spacer thickness is substantially within the range of approximately 50–100 microns.

17. The electronic assembly of claim 11, wherein the thickness of the thermally conductive material on the second microelectronic component is greater than the thickness of the thermally conductive material on the spacer by approximately 0.1 millimeters.

18. The electronic assembly of claim 11, wherein the heat dissipation device comprises at
    one or more of: one or more active and/or passive thermal solutions, wherein said thermal solutions include:
    fans, refrigeration components, thermoelectric components, heat spreaders, including integrated heat spreaders (IHS), heat slugs, and/or heat sinks.

19. The electronic assembly of claim 11, wherein the apparatus comprises a multichip module (MCM).

20. A method of forming an electronic assembly, comprising:

coupling a spacer to one of a plurality of microelectronic components coupled to a substrate, wherein the spacer is formed from substantially similar material as at least one of the plurality of microelectronic components; and coupling a heat dissipation device to the spacer and at least one other of the plurality of microelectronic components, such that there is a thermal conductivity between the heat dissipation device and the spacer, and between the heat dissipation device and the at least one other of the plurality of microelectronic components, wherein the thermal conductivity is greater between the heat dissipation device and the spacer than between the heat dissipation device and the at least one other of the plurality of microelectronic components.

21. The method of claim 20, wherein the electronic assembly comprises a multichip module (MOM).

22. The method of claim 20, wherein the spacer and the one of a plurality of microelectronic components are substantially formed from silicon.

23. A method of claim 20, wherein the spacer is coupled to the one of a plurality of microelectronic components by use of one or more thermally conductive materials, wherein the one or more thermally conductive materials at least one of the following materials:
    (a) thermally conductive gels, greases, epoxies, pastes, solders, phase change material; and/or
    (b) metal filled polymers, gels or epoxies, which may have one or more types of thermally conductive fillers such as aluminum particles and/or silver particles interspersed therein.

24. The method of claim 20, wherein the heat dissipation device comprises at one or more of: active and/or passive thermal solutions, wherein said thermal solutions include:
    fans, refrigeration components, thermoelectric components, heat spreaders, including integrated heat spreaders (IHS), heat slugs, and/or heat sinks.

25. The method of claim 20, wherein the he at dissipation device is coupled to the spacer by use of one or more thermally conductive materials, wherein the one or more thermally conductive materials at least one of the following materials:
    (a) thermally conductive gels, greases, epoxies, pastes, solders, phase change material; and/or
    (b) metal filled polymers, gels or epoxies, which may have one or more types of thermally conductive fillers such as aluminum particles and/or silver particles interspersed therein.

* * * * *